(12) United States Patent
Martin et al.

(10) Patent No.: US 7,973,417 B2
(45) Date of Patent: Jul. 5, 2011

(54) INTEGRATED CIRCUIT AND METHOD OF FABRICATING THE SAME

(75) Inventors: Alfred Martin, Munich (DE); Barbara Hasler, Munich (DE)

(73) Assignee: Qimonda AG, Munich (DE)

( * ) Notice: Subject to any disclaimer, the term of this patent is extended or adjusted under 35 U.S.C. 154(b) by 516 days.

(21) Appl. No.: 12/105,489

(22) Filed: Apr. 18, 2008

(65) Prior Publication Data

US 2009/0261480 A1    Oct. 22, 2009

(51) Int. Cl.
*H01L 23/48* (2006.01)
*H01L 23/52* (2006.01)
*H01L 29/40* (2006.01)
*H01L 21/44* (2006.01)

(52) U.S. Cl. .................. 257/779; 257/E23.02; 438/612

(58) Field of Classification Search .................. 257/779, 257/786, E23.02; 438/612
See application file for complete search history.

(56) References Cited

U.S. PATENT DOCUMENTS

| | | | |
|---|---|---|---|
| 5,135,606 A | 8/1992 | Kato et al. | |
| 5,587,623 A | 12/1996 | Jones | |
| 5,747,101 A | 5/1998 | Booth et al. | |
| 6,047,044 A | 4/2000 | Lehmann et al. | |
| 6,191,952 B1 | 2/2001 | Jimarez et al. | |
| 6,245,595 B1 | 6/2001 | Nguyen et al. | |
| 6,495,916 B1 | 12/2002 | Ohuchi et al. | |
| 6,683,379 B2 | 1/2004 | Haji et al. | |
| 7,217,890 B2 | 5/2007 | Suemasu et al. | |
| 7,263,769 B2 | 9/2007 | Morimoto et al. | |
| 7,745,321 B2 | 6/2010 | Martin et al. | |
| 7,814,651 B2 | 10/2010 | Suemasu et al. | |
| 7,829,380 B2 | 11/2010 | Irsigler et al. | |
| 2003/0001992 A1 | 1/2003 | Kawase et al. | |
| 2006/0180940 A1 | 8/2006 | Kirby et al. | |
| 2006/0261493 A1 | 11/2006 | Boon | |
| 2008/0099925 A1 | 5/2008 | Irsigler et al. | |
| 2009/0179333 A1* | 7/2009 | Martin et al. ................ | 257/779 |

FOREIGN PATENT DOCUMENTS

| | | |
|---|---|---|
| DE | 19542043 | 8/1996 |
| DE | 19729596 | 1/1999 |
| DE | 10351924 | 6/2004 |
| JP | 01144653 | 6/1989 |
| JP | 3627856 | 5/2002 |
| JP | 2002158191 | 3/2005 |

OTHER PUBLICATIONS

Office Action History of U.S. Appl. No. 11/972,973, dates ranging from Sep. 3, 2009 to Feb. 5, 2010.
Office Action History of U.S. Appl. No. 11/589,986, dates ranging from Jun. 12, 2008 to Jun. 30, 2010.

* cited by examiner

*Primary Examiner* — Jenny L. Wagner
(74) *Attorney, Agent, or Firm* — Patterson & Sheridan, LLP

(57) ABSTRACT

An article including a substrate having a blind hole formed therein, wherein the blind hole is defined by a floor and a sidewall and a solder connection is provided. The solder connection may couple a first contact pad to a second contact pad. The first contact pad may cover a first field of the floor of the blind hole, and may also promote wetting of a solder material of the solder connection. Wetting may be impeded on a second field of the floor of the blind hole. The second contact pad may be arranged above a surface of a further substrate, wherein the surface of the further substrate may be oriented perpendicularly to the floor of the blind hole in the substrate.

25 Claims, 12 Drawing Sheets

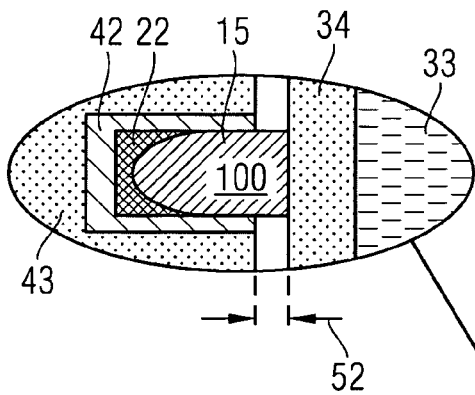
FIG 4A
FIG 4
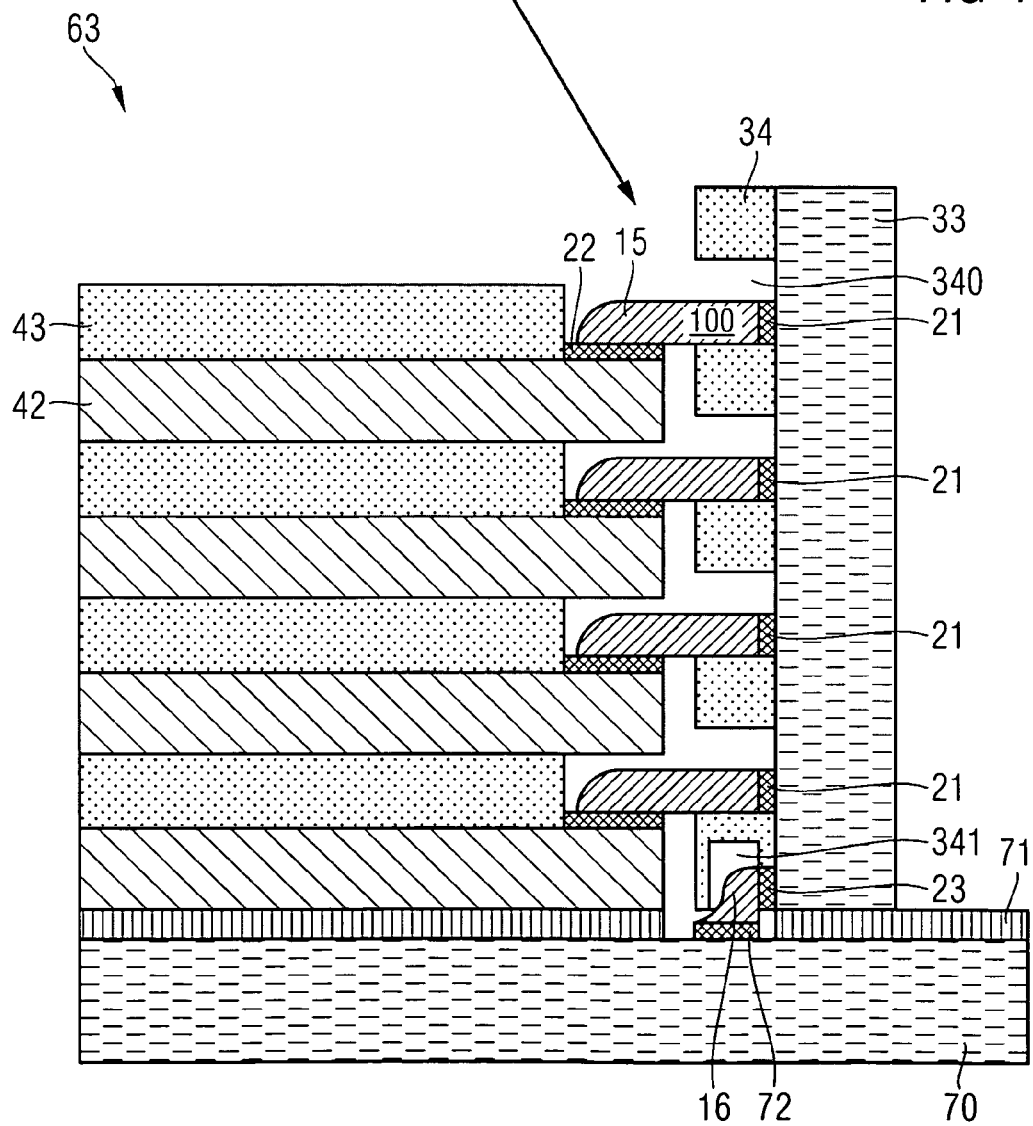

INTEGRATED CIRCUIT AND METHOD OF FABRICATING THE SAME

BACKGROUND

A solder connection couples contact pads in particular of integrated circuits.

BRIEF DESCRIPTION OF THE DRAWINGS

The recited features will become clear from the following description of embodiments of the present invention, taken in conjunction with the accompanying drawings. It is to be noted, however, that the accompanying drawings illustrate only typical embodiments of the present invention, and are, therefore, not to be considered limiting of the scope of the invention. The present invention may admit equally effective embodiments.

FIGS. 3, 3A, 4, and 4A show a schematic view of a circuit system in different stages during fabrication, according to another embodiment of the present invention.

DETAILED DESCRIPTION OF THE PREFERRED EMBODIMENT

The present invention is generally related to solder connection for integrated circuits.

In one embodiment, an article may comprise a substrate having a blind hole formed therein, wherein the blind hole is defined by a floor and a sidewall and a solder connection. The solder connection may couple a first contact pad to a second contact pad. The first contact pad may cover a first field of the floor of the blind hole, and may also promote wetting of a solder material of the solder connection. Wetting may be impeded on a second field of the floor of the blind hole. The second contact pad may be arranged above a surface of a further substrate, wherein the surface of the further substrate may be oriented perpendicularly to the floor of the blind hole in the substrate.

Figure 1A:
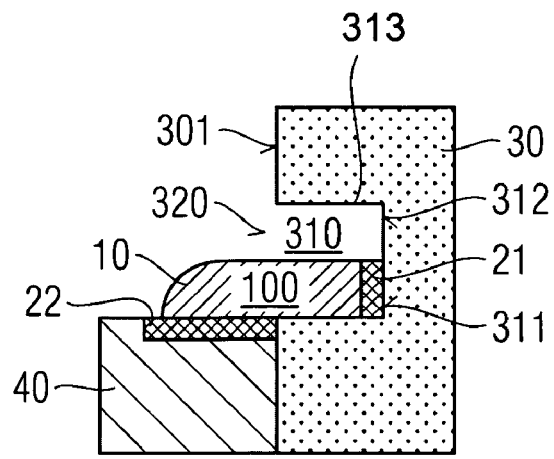
FIGS. 1A through 1C show schematic views of solder connections according to embodiments of the present invention.

FIG. 1A shows a schematic view of a solder connection according to an embodiment of the present invention. A solder connection 10 may couple a first contact pad 21 to a second contact pad 22. The first contact pad 21 may be arranged on a floor of a blind hole 310 in a substrate 30. The blind hole may be defined by a floor and a sidewall 313. The blind hole 310 may form an aperture 320 in a top face 301 of the substrate 30. A first field 311 of the floor of the blind hole 310 may be covered by the contact pad 21. The material and/or the surface of the first contact pad 21 may provide a wetting to a solder material 100 in a liquid or solderable state, whereas the material and/or the surface of a second field 312 of the floor of the blind hole 310 may impede such a wetting by a liquid solder material 100. The second contact pad 22 may be arranged perpendicular to the first contact pad 21 and on or above the top face 301 of the substrate 30.

The second contact pad 22 may be arranged on a further substrate 40, such as a circuit chip, a chip, and/or a chip substrate, and provide a pad size below 500 microns×500 microns, below 100 microns×100 microns, or below 50 microns×50 microns. The first contact pad 21 may provide a pad size below 200 microns×500 microns, below 50 microns×100 microns, or below 30 microns×80 microns, and may provide a large pad size than the size of the second contact pad 22 on a chip 41. In addition, the first contact pad 21 and/or the second contact pad 22 may comprise a pad metallization, such a metallization comprising metals, such as copper, nickel, or gold. A respective metallization thickness may be in a range of 100 nm to 5 microns. As an example, the pads 21, 22 may comprise a metallization of 1 to 3 microns copper, 1 to 3 microns nickel, and 100 nm to 200 nm gold.

The solder material 100 may comprise any suitable solder material, such as tin, copper, silver, lead, bismuth, and the common alloys thereof. The solder material 100 may furthermore comprise a flux material, such as urea, colophony, a resin, zinc chloride, and/or other flux materials as they are known from the technology of soldering. In addition to this, the solder material 100 may comprise a eutectic alloy providing a minimized melting temperature, such as a melting temperature below 180° C., below 200° C., below 220° C., or below 240° C.

The first contact pad 21, the second contact pad 22, and/or a surface thereof may provide a wetting to a liquefied solder material 100. The provision of a wetting may enable or promote the formation of a solder connection and/or a formation of a surface alloy of a liquefied solder material 100 and the respective materials of the first contact pad 21 and/or the second contact pad 22. The second field 312 of the floor of the blind hole 310 and/or the remaining side walls of the blind hole 310 may impede such a wetting by a liquefied solder material 100. An impeding of a wetting by a liquid solder material may be provided by a plastic material, a ceramic material, a crystalline material, a semiconductor materials, a polymer material, polyimide (PI), polymethylmethacrylate (PMMA), a photoresist material, an SU-8 photoresist material ('SU-8' being a trade name for a commercially available resist of the Microchem Corp.), an oxide material, a resist layer, an oxide layer, a silica layer, or a silicon-nitride layer.

The solder material 100 of the solder connection 10 may be arranged above a pad surface of the first contact pad 21 and above a pad surface of the second contact pad 22. A remainder of the blind hole 310 may be devoid of any solder material 100. Furthermore, the solder material 100 may cover the entireties of the surfaces of the first contact pad 21 and the second contact pad 22, or only a fraction thereof. Such a fraction may comprise more than 10%, more than 33%, and/or more than 50% of the pad surface of, for example, the second contact pad 22.

Figure 1B:
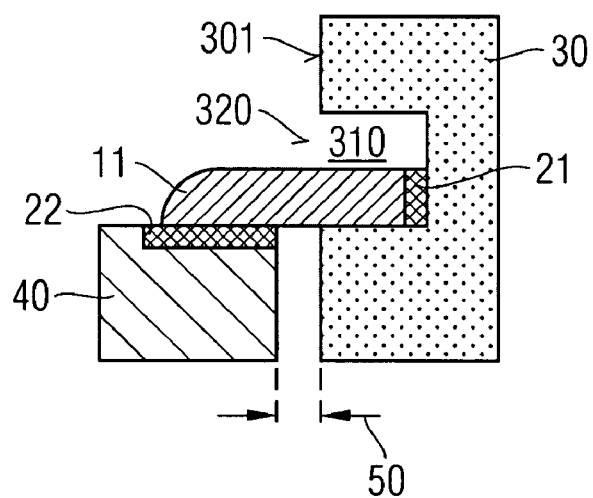

FIG. 1B shows a schematic view of a solder connection according to another embodiment of the present invention. Accordingly, a solder connection 11 may couple the first contact pad 21 to the second contact pad 22. According to this embodiment, however, the solder connection 11 may bridge a gap 50 between the substrate 30 and the second contact pad 22. The gap may be formed between the substrate 30 and the second contact pad 22 and/or the substrate 40. The gap 50 may be larger than 1 micron, larger than 10 microns, or larger than 20 microns. In another embodiment, the gap 50 may be as large as a liquefied solder material 100 protruding from the blind hole 310, may wet a fraction of the second contact pad 22, and may bridge the gap 50.

Figure 1C:
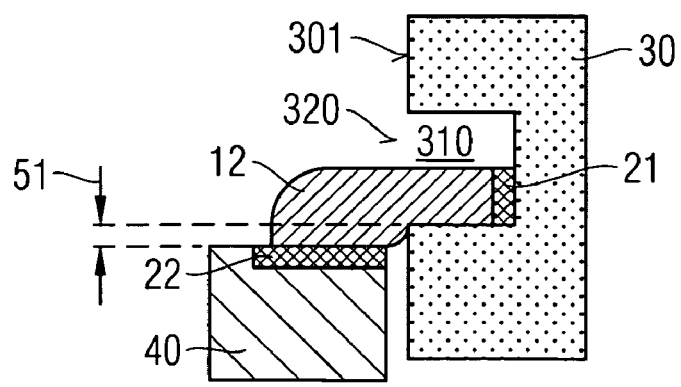

FIG. 1C shows a schematic view of a solder connection according to another embodiment of the present invention. A solder connection 12 may couple the first contact pad 21 to the second contact pad 22. According to this embodiment, the second contact pad 22, and/or the substrate 40 may be arranged relative to the substrate 30, such that there is an offset 51 between the surface of the second contact pad 22 and an edge of the blind hole 310. In general, the second contact pad 22 may be arranged on or above the surface 301 of the substrate 30 in an area of the aperture 320 of the blind hole 310. The area of the aperture 320 may comprise the aperture 320 itself and a surrounding area, this area being a fraction of the surface 301. The surrounding area may extend from an edge of the aperture 320 more than 1 micron, more than 10 microns, or more than 100 microns. The solder connection 12 may furthermore not only bridge a vertical offset 51 but may also, at the same time, bridge a horizontal gap 50, as has been described in conjunction with FIG. 1B.

Figure 2A:
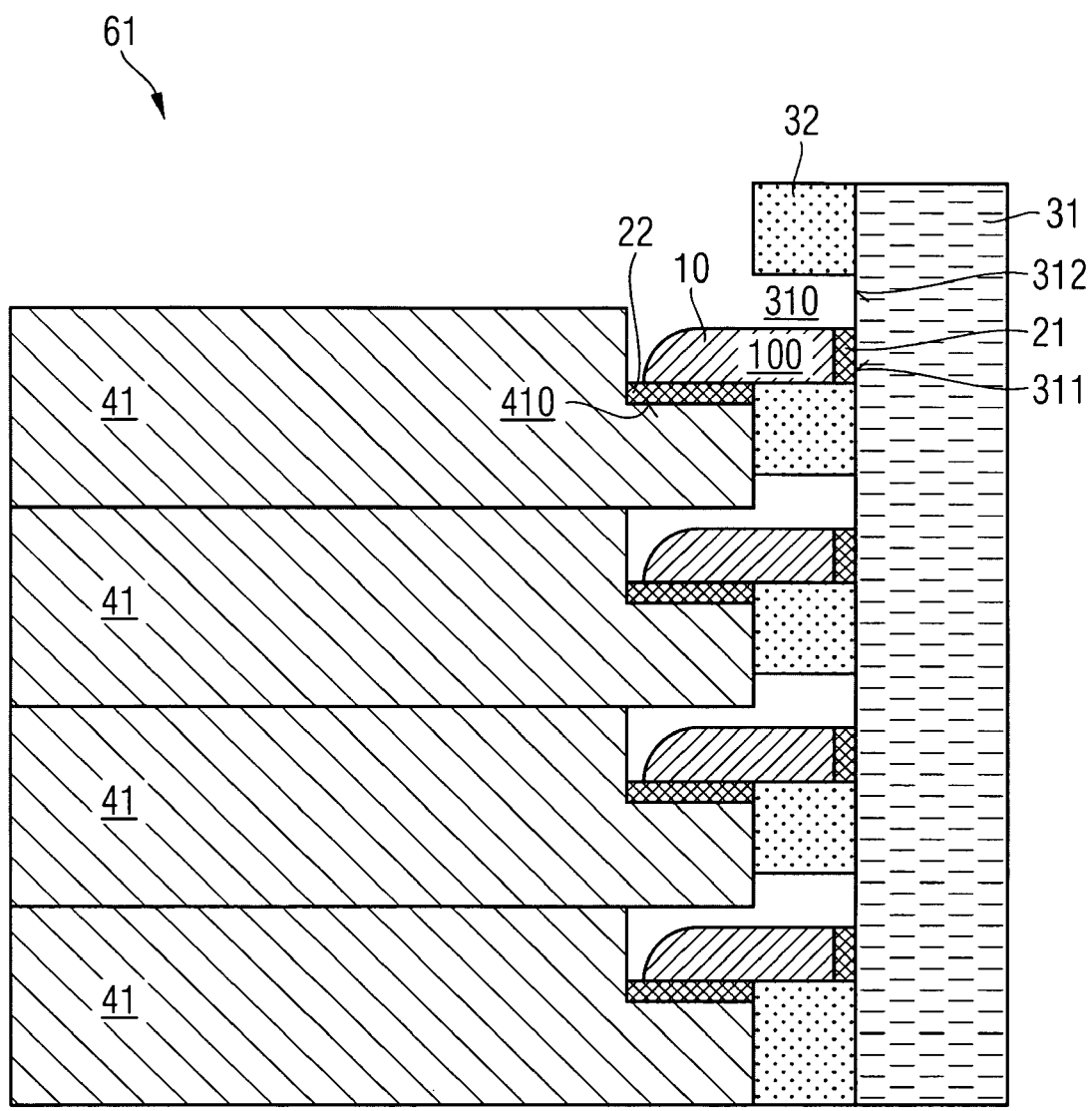
FIGS. 2A and 2B show schematic views of integrated circuits according to further embodiments of the present invention.

FIG. 2A shows a schematic view of an integrated circuit according to another embodiment of the present invention. An integrated circuit 61 may comprise a stack of several circuit chips 41. The constituent circuit chips 41 may be identical or equivalent circuit chips, i.e. of the same type, or may each comprise different and/or corresponding integrated circuits. On a top face 410 of each circuit chip 41 there may be arranged the second contact pad 22. As shown here, the second contact pad 22 may be furthermore arranged within a rim area of the top face 410, such that it is arranged in the vicinity of an edge of the circuit chip 41.

The second contact pad 22 may reach up to this edge, may extend above the edge and/or a side face of the circuit chip 41, or may leave a fraction of the top face 410 between the edge and the second contact pad 22. In the case, the second contact pad 22 leaves open a fraction of the top face 410, a distance left open, measured between the edge of the circuit chip 41 and the facing edge of the second contact pad 22, may be below 20 microns, below 10 microns, or below 5 microns. The top face 410 may be formed on a cornice and/or an opening of circuit chip 41, such as to allow for a stacking of several circuit chips 41. A thickness of the chips 41 may furthermore be in a range between 10 microns and 100 microns, or between 40 microns and 80 microns, and may include an additional spacer layer such to allow for stacking the chips 41.

Further, a substrate 31 may comprise a perforated layer 32 which provides the blind holes 310. The first field 311 of the floor of the blind hole 310 is covered by the first contact pad 21, which provides a wetting to liquefied solder material 100. The second field 312 of the floor of the blind hole 310, and the remaining side walls of the blind hole 310 within the perforated layer 32, however, may impede a wetting by the liquefied solder material 100. The perforated layer 32 may comprise a polymer, such as polyimide, PMMA, a structured resist layer, and/or a structured SU-8 photoresist layer. In this way, the blind holes 310 may be structured in the layer 32 by means of lithographic, developing, and/or etching techniques. In general, the minimum dimensions of the blind hole 310, or any other structural feature of the structured layer 32 may depend on or may determined by the properties of the material of the structured layer 31, e.g. a respective polymer.

A thickness of the substrate 31 may be in a range between 100 microns and 800 microns, or between 200 microns and 500 microns, whereas a thickness of the structured layer 32 may be in a range between 20 microns and 100 microns or between 30 microns and 75 microns. The thickness of the structured layer 32 may furthermore be chosen, such to determine a desired volume of the blind holes 310 and/or a volume of solder material 100 of the solder connections 11.

According to this embodiment, the stack of the circuit chips 41 may reach up to the top face of the perforated layer 32. The solder connections 10 may couple the second contact pads 22 of a respective circuit chip 41 to a respective first contact pad 21 on the top face of the substrate 31. The substrate 31 may further comprise signal lines, a redistribution layer, a signal distribution layer, such to connect and/or route signals from the first contact pad 21 to a further contact pad, to a next first contact pad 21, and/or to an external circuitry. In this way, several circuit chips 41 may be contacted in a reliable, reproducible, cost effective, and/or simple way to each other, and/or to an external circuitry.

Figure 2B:
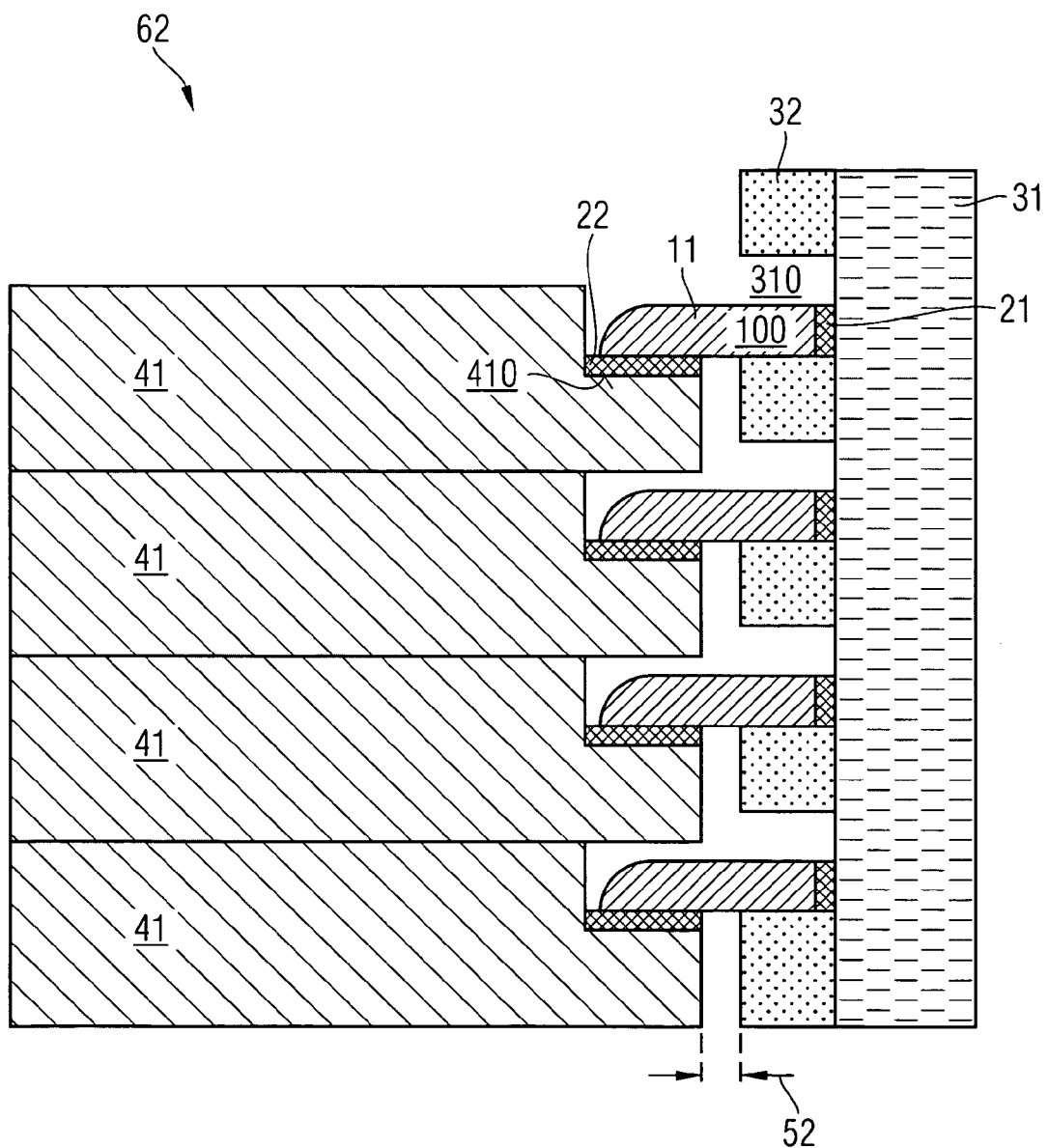

FIG. 2B shows a schematic view of an integrated circuit according to another embodiment of the present invention. Accordingly, an integrated circuit 62 may comprise the stack of the circuit chips 41 and the substrate 31. According to this embodiment, the stacked circuit chips 41 may be arranged relative to the substrate 31 such that a gap 52 is formed between the edge of the circuit chips 41 and the top face of the perforated layer 32. The solder connections 11 may bridge this gap 52 such to allow for a misalignment of the constituent circuit chips 41 amongst each other and/or a misalignment of the stack of the circuit chips 41 relative to the substrate 31. This misalignment may result from uncertainties and/or variations due to fabrication and/or the types of the circuit chips 41. The gap 52 may be in a range of 1 to 5 microns, in a range of 5 to 15 microns, in a range of 15 to 30 microns, or above 30 microns. Furthermore, a misalignment below 20 microns, below 10 microns, or below 5 microns may cause the gap 52, which, in such a case, is not constant and varies along a side face of the chip stack of the chips 41.

Figure 3A:
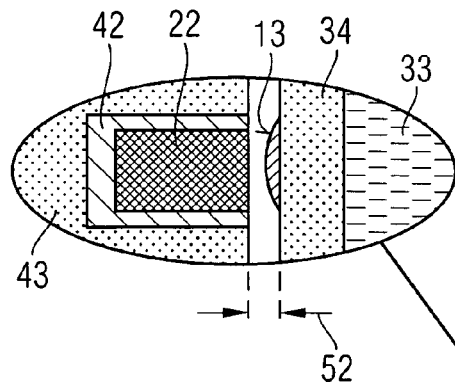
Figure 3:
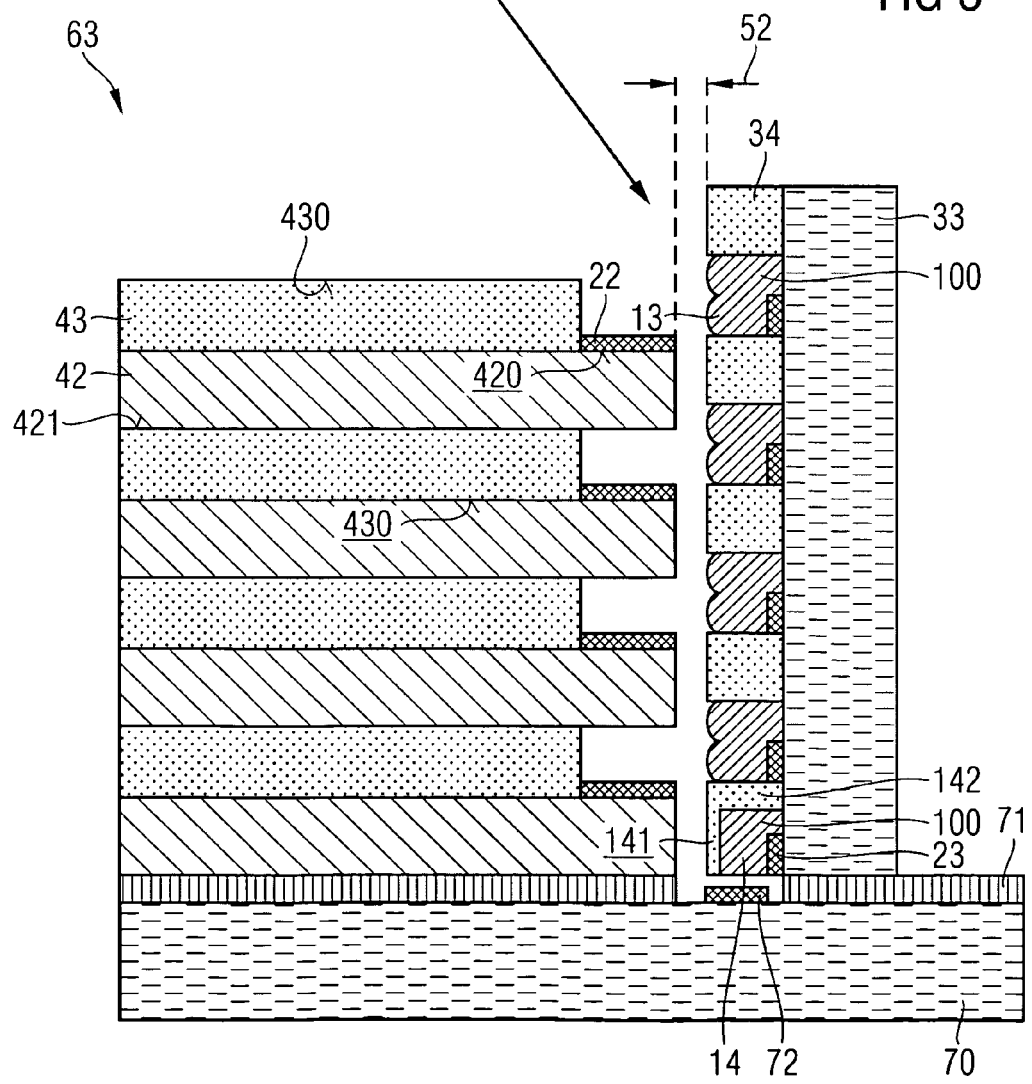

FIGS. 3 and 3A show schematic views of a circuit system in a first stage during fabrication according to another embodiment of the present invention. A circuit stack 63 may comprise circuit chips 42 and spacer layers 43. The spacer layers 43 may be arranged on a top face 420 of the circuit chips 42. On the top face 420 of the circuit chips 42 there may be arranged second contact pads 22. The constituent circuit chips 42 may be stacked such that a floor 421 of the circuit chip 42 faces a top face 430 of an underlying spacer layer 43. The stack 63 may be arranged on a carrier board 70, which may be or comprise a chip carrier, a carrier substrate, a printed circuit board (PCB), a motherboard, and/or a memory module board. The stack 63 may be bound to the carrier board 70 by means of an adhesive layer 71, such as a die attach foil or a layer comprising a glue or an adhesive.

The second contact pads 22 may be arranged close to an edge or in a rim area of the circuit chip 42, which may include the provision of redistribution layer (RDL) to allow for a placement of the contact pads 22 as close as possible to an edge of the circuit chip 42. Furthermore, the circuit chips 42 may have been thinned and/or passivated prior to stacking and forming the chip stack 63.

A substrate 33, comprising a perforated layer 34 may be arranged next to the stack 63 on the carrier board 70, also by means of the adhesive layer 71. The substrate 33 may be arranged relative to the chip stack 63 such that the gap 52 is formed. The perforated layer 34 may comprise first portions 13 of the solder material 100 in blind holes that form an aperture toward the stack 36. Furthermore, the perforated layer 34 may comprise a solder material 100 in a further blind hole 14, that forms an aperture toward a top face of the carrier board 70. On the top face of the carrier board 70 there may be arranged a further contact pad 72, and a further contact pad 23 may be arranged on the top face of the carrier substrate 33 in the further blind hole 14.

A blind hole with an aperture toward a side face, such as the buried further blind hole 14, may be obtained by means of a double layer process applying a lithography employing two masks and/or employing two wavelengths. The structured layer 34, in such a case, may comprise two partial structured layers. One structuring and/or lithography may then yield a side wall 142 of the blind hole 14, whereas a second structuring and/or lithography may then yield a cap 141 of the blind hole 14.

The thickness of the substrate 33 and the chips 42, as well as pad sizes and gap sizes may be such as being described in conjunction with an embodiment of the present invention. In addition to this, a thickness of the adhesive layer 71 may be in a range between 2 microns and 20 microns, or between 7 microns and 12 microns. The spacer layers 43 may comprise the material of the structured layer 34, or may form a structured layer for themselves. Suitable materials of the spacer layers 43 include photoresist materials and SU-8 photoresist materials, with a layer thickness in the range between 5 microns and 50 microns, or between 15 microns and 30 microns.

FIG. 3A shows a schematic top view of a fraction of the integrated circuit according to this embodiment of the present invention. There, it is shown the top second contact pad 22 on the top circuit chip 42. The portion 13 of the solder material 100 may extend from the top face of the perforated layer 34. The protruding portion of the portion 13 may or may not bridge the gap 52 between the chip stack 63 and the structured layer 34.

FIGS. 4 and 4A show schematic views of the circuit system in a subsequent stage during fabrication according to this embodiment of the present invention. Accordingly, solder connections 15 may couple the respective first contact pads 21 to the respective second contact pads 22. Solder material 100 may protrude from a fraction 340 of the blind hole of the perforated layer 34 such to provide solder material 100 for the formation of the solder connection 15 to the second contact pad 22. In a similar way, solder material 100 may protrude from the fraction 341 of the further blind hole such to provide solder material 100 for a solder connection 16 coupling the further contact pad 23 on the substrate 33 to the contact pad 72 on the carrier board 70.

The solder connections 15, 16 may have been formed during a heating stage, such as a reflow soldering stage, according to an embodiment of the present invention. Therein, the liquefied solder material 100 within the blind holes of the structured layer 34 may protrude from the respective blind hole, due to the impeding of a wetting by a liquefied solder material of the surfaces and/or materials of a fraction of the floor and/or the side walls of the blind holes in the structured layer 34. A filling of and protrusion from the blind holes is described in conjunction with FIGS. 9A through 9F.

FIG. 4A shows a schematic top view of a fraction of the circuit system according to this embodiment of the present invention. As shown here, solder material 100 may protrude from the blind hole of the structured layer 34, such to form the solder connection 15, which covers a fraction of the surface of the second contact pad 22. The solder connection 15 may bridge the gap 52 between the chip stack 63 and the structured layer 34.

Figure 5A:
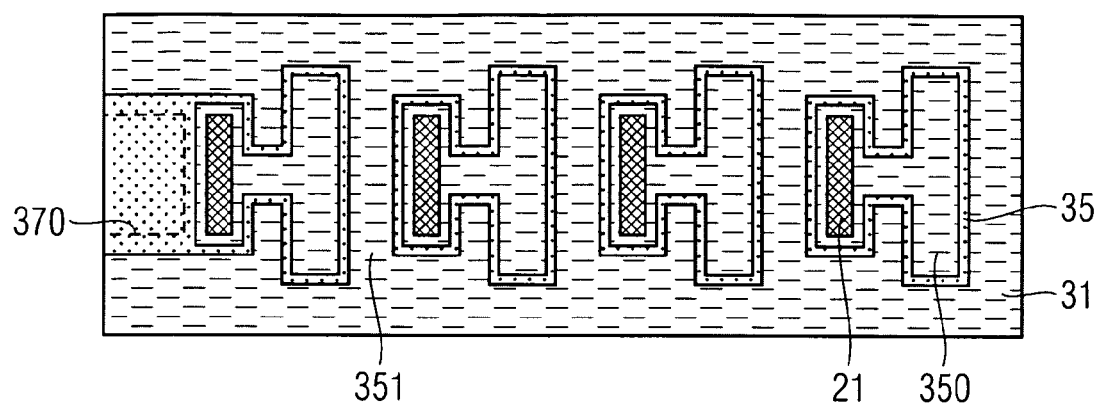
FIGS. 5A through 5D show schematic views of substrates according to further embodiments of the present invention.

FIG. 5A shows a schematic top view of a substrate according to an embodiment of the present invention. Accordingly, a substrate 31 and a perforated layer 35 on the substrate 31 are provided. The perforated layer 35 may comprise blind holes 350 which may be filled by a material, such as the solder material 100. On a floor of the blind hole 350 there may be arranged the first contact pad 21. The perforated layer 35, according to this embodiment, may comprise gaps 351 between islands that comprise the blind holes 350. The gaps 351 may reach down to the surface of the substrate 31. In this way, a material usage may be rendered more effective, and/or electromagnetic, high-frequency and/or physical or mechanical properties of the perforated layer 35 may be enhanced.

A wall thickness of the perforated layer 35, surrounding the blind hole 350, may be in a range between 5 microns and 30 microns, or between 10 microns and 20 microns. The gaps 351 may separate the islands of the layer 35 and may be in a range between 5 microns and 30 microns, or between 10 microns and 20 microns. In addition, the size of the floor of the blind hole 350 which is not covered by the contact pad 21 may, i.e. the cross-section of a solder material reservoir, may be equal to the size of the first contact pad 21 and/or the second contact pad 22.

Adjacent to a side face of the substrate 31, there may be arranged a further blind hole 370 in the structured layer 35. The further blind hole 370 may form an aperture toward the side face of the substrate 31, i.e. toward a plane which is arranged perpendicular to a plane that comprises an aperture of a blind hole 350. On a side wall of the further blind hole 370 there may be arranged a further contact pad 23, which may, in this case, be arranged on a surface of the substrate 31. The further contact pad 23 (as illustrated in FIG. 5B) provides a wetting to liquefied solder material 100, whereas the remainder of side walls and/or the floor of the further blind hole 370 may impede such a wetting.

Figure 5B:
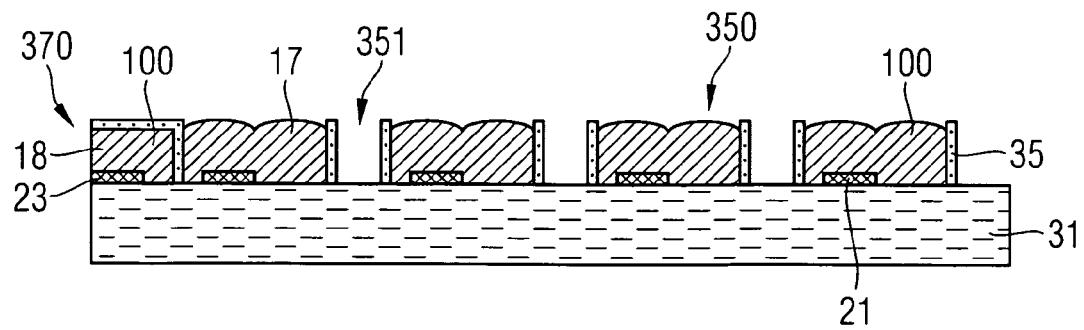

FIG. 5B shows a schematic side view of the substrate as being described in conjunction with FIG. 5A. In this view, the blind holes 350 may be filled with portions 17 of the solder material 100 and the further blind hole 370 may be filled with a portion 18 of the solder material 100. During a subsequent process stage, the solder material 100 may protrude from the blind holes 350 and the further blind hole 370, such to form solder connections toward different directions, for example toward perpendicular directions.

Figure 5C:
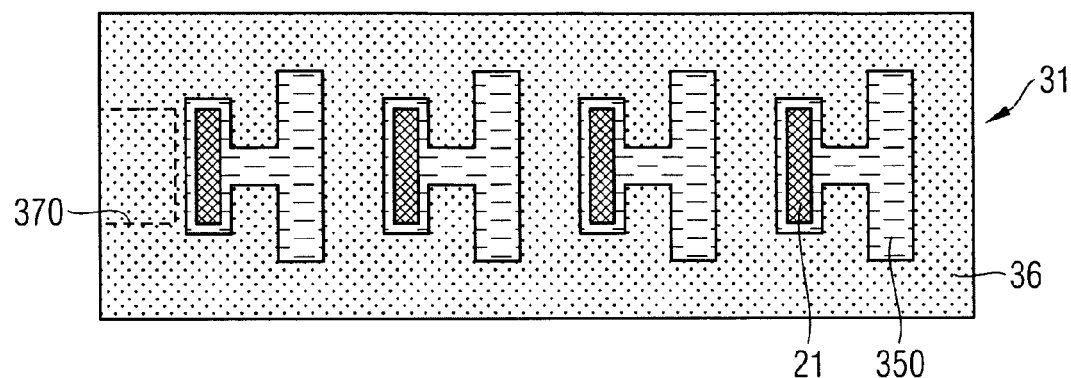
Figure 5D:
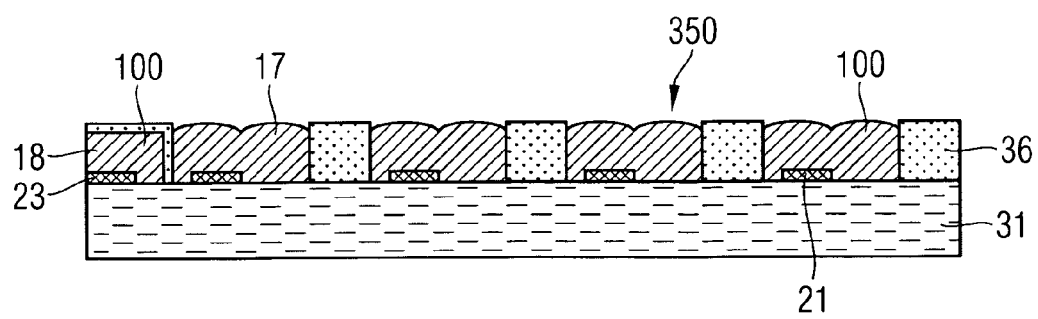

FIG. 5C shows a schematic view of the substrate 31 according to another embodiment of the present invention. On the substrate 31 there may be arranged a perforated layer 36, which comprises the blind holes 350 and the further blind hole 370 (a through hole of the perforated layer and a surface of an underlying remainder of the substrate form the blind hole). Contact pads 21 and a further contact pad 23 (as illustrated in FIG. 5D) may be provided as described in conjunction with FIG. 5A. According to this embodiment, however, the perforated layer 36 forms a continuous layer, which may ease fabrication or provide uniform mechanical, physical, and/or electronic properties.

FIG. 5D shows a schematic side view of the substrate as being described in conjunction with FIG. 5C. In this view, the blind holes 350 may be filled with portions 17 of the solder material 100 and the further blind hole 370 may be filled with a portion 18 of the solder material 100. Thus, the solder material 100 may protrude from the blind holes 350 and the further blind hole 370 toward different directions.

Figure 6A:
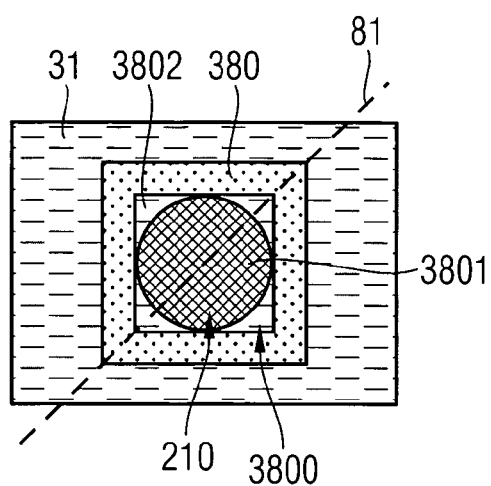
FIGS. 6A through 6D show schematic views of a solder connection in various stages during fabrication according to another embodiment of the present invention.

FIGS. 6A through 6D show a solder connection in various stages during manufacturing according to a further embodiment of the present invention. FIG. 6A shows a schematic top view of a blind hole 3800 in a structured layer 380. The structured layer 380 may be arranged in islands on the substrate 31, the islands surrounding the blind hole 3800. The floor of the blind hole 3800 may comprise a first field 3801 and a second field 3802. The first field 3801 may be covered by a contact pad 210 which may provide a wetting to liquefied solder material 100, whereas the material and/or the surface in the area of the second field 3802 may impede such a wetting.

According to this embodiment, the first field 3801 and the contact pad 210 may comprise a round shape, whereas the second field 3802 comprises the remainder of a rectangular or square shape when being reduced of the first field 3801. The rectangular or square shape may correspond to a cross-section of the blind hole 3800.

Figure 6B:
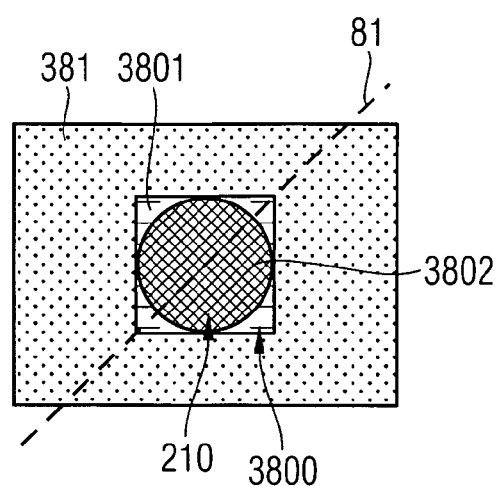

FIG. 6B shows a schematic top view of the blind hole 3800, as being described in conjunction with FIG. 6A. According to another embodiment, the blind hole 3800 may be arranged in a structured layer 381 that may comprise and/or forms a continuous layer, for example, a continuous layer as being described in conjunction with FIGS. 5C and 5D.

Figure 6C:
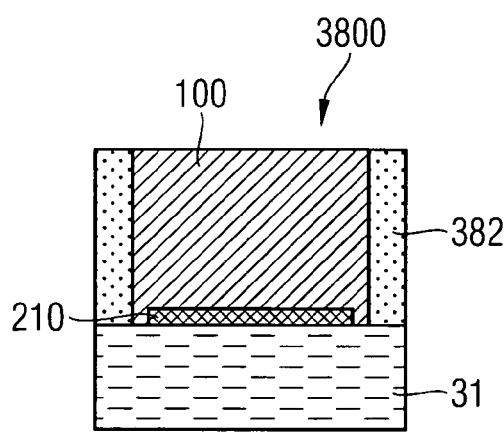

FIG. 6C shows a schematic cross-sectional view of the arrangement according to the embodiments as being described in conjunction with FIG. 6A or FIG. 6B. The cross-sectional view is along the axis 81 as drawn in those Figures and shows the blind hole 3800 in a structured layer 382, which may correspond to the structured layer 380 or to the continuous structured layer 381. In this view, the blind hole 3800 may be filled with the solder material 100 according to an embodiment of the present invention.

Figure 6D:
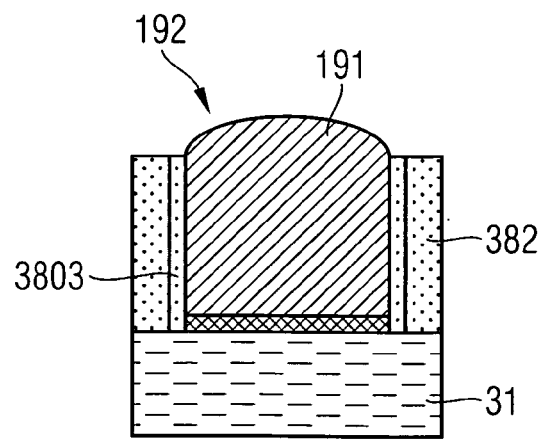

FIG. 6D shows a schematic cross-sectional view of the arrangement as drawn in FIG. 6C with a portion of the solder material 100 protruding from the blind hole 3800. During ejection, solder material 100 may have been displaced from reservoir volumes 3803, such to provide solder material 100 for a protruding portion 192 of a solder connection 191. The reservoir volume 3803 may comprise the partial volumes of the blind holes 3800 above the second field 3802. According to this embodiment, protrusion reservoirs may be provided, while keeping the complexity of the geometry of the blind holes 3800 and the contact pad 210 low. Therefore the features of the structured layer 382 may turn out simple, which may, in turn, ease process techniques and may increase process yield.

Figure 7A:
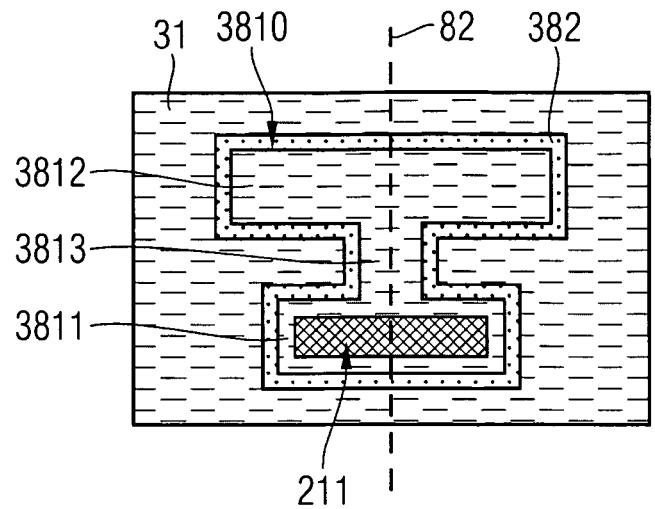
FIGS. 7A through 7D show schematic views of a solder connection in various stages during manufacturing according to another embodiment of the present invention.

FIGS. 7A through 7D show a solder connection in various stages during manufacturing according to a further embodiment of the present invention. FIG. 7A shows a schematic top view of a blind hole 3810 in a structured layer 382. The structured layer 382 may be arranged in islands on the substrate 31, the islands surrounding the blind hole 3810. The floor of the blind hole 3810 may comprise a first field 3811 and a second field 3812. The first field 3811 may be covered by a contact pad 211 which may provide a wetting to liquefied solder material 100, whereas the material and/or the surface in the area of the second field 3812 may impede such a wetting.

According to this embodiment, the first field 3811, the second field 3812, and the contact pad 211 may comprise a rectangular or a square shape. The first field 3811 and the second field 3812 may be connected by a channel field 3813. The partial volumes of the blind hole 3810 therefore may form a continuous volume and comprise a first partial volume above the first field 3811, a second partial volume above the second field 3812, and a channel volume above the channel field 3813. The contact pad 211 may cover the entirety of the first field 3811 or just a fraction thereof. Furthermore, the size of the second field 3812 may correspond to the size of a further contact pad, to which a solder connection is supposed to be formed. In addition, the size of the second field 3812 may be chosen, such to provide a required reservoir volume for solder material 100.

Figure 7B:
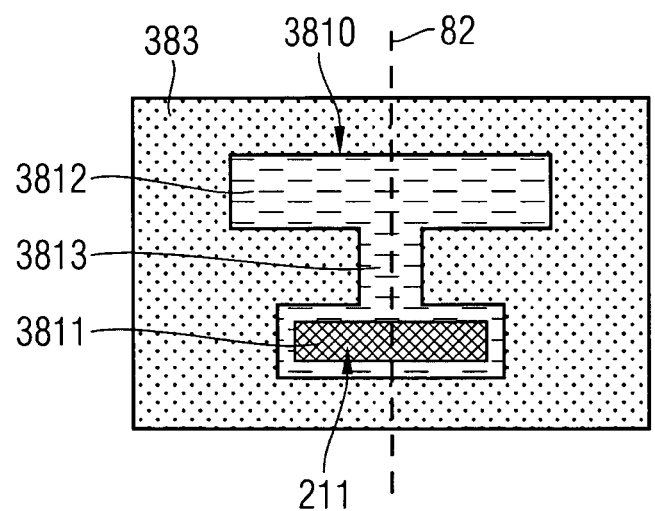

FIG. 7B shows a schematic top view of the blind hole 3810, as being described in conjunction with FIG. 7A. According to another embodiment, the blind hole 3810 may be arranged in a structured layer 383 that comprises and/or forms a continuous layer, for example, a continuous layer as being described in conjunction with FIGS. 5C and 5D.

Figure 7C:
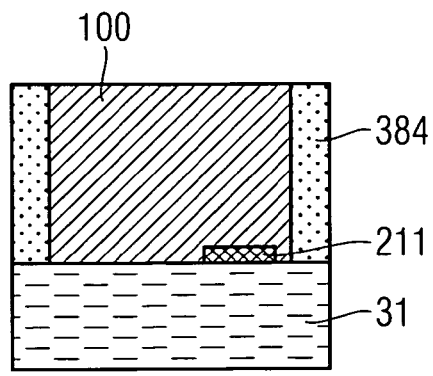

FIG. 7C shows a schematic cross-sectional view of the arrangement according to the embodiments as being described in conjunction with FIG. 7A or FIG. 7B. The cross-sectional view is along the axis 82 as drawn in those Figures and shows the blind hole 3810 in a structured layer 384, which may correspond to the structured layer 382 or to the continuous structured layer 383. In this view, the blind hole 3810 may be filled with the solder material 100 according to an embodiment of the present invention.

Figure 7D:
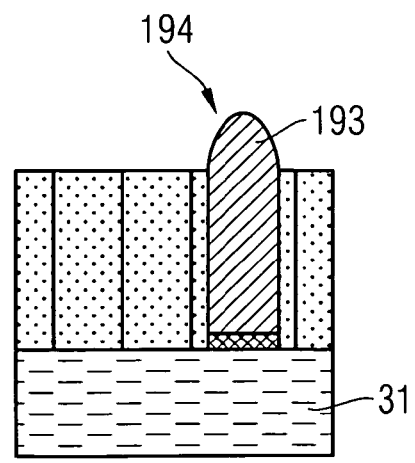

FIG. 7D shows a schematic cross-sectional view of the arrangement as drawn in FIG. 7C with a portion of the solder material 100 protruding from the blind hole 3810. During the protrusion process, solder material 100 may have been displaced from reservoir volumes, such as the second partial volume and the channel volume. In this way, solder material 100 may be provided to form a protruding portion 193 of a solder connection 194. According to this embodiment, the size and volume of ejection reservoirs may be independent from the size of the contact pad 211. In particular, the amount of solder material 100 which may be necessary to form the solder connection 193, may be an increased volume such to allow for even long and/or large solder connections 193.

Figure 8A:
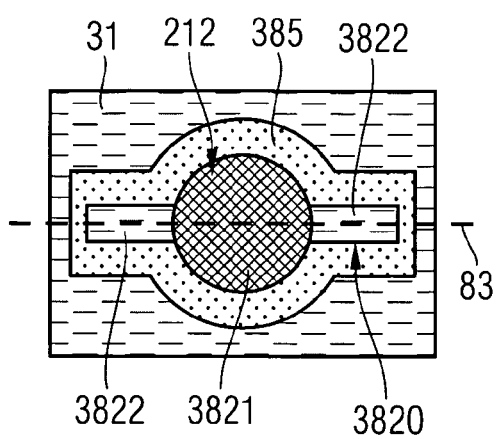
FIGS. 8A through 8D show schematic views of a solder connection in various stages during fabrication according to another embodiment of the present invention.

FIGS. 8A through 8D show a solder connection in various stages during manufacturing according to a further embodiment of the present invention. FIG. 8A shows a schematic top view of a blind hole 3820 in a structured layer 385. The structured layer 385 may be arranged in islands on the substrate 31, the islands surrounding the blind hole 3820. The floor of the blind hole 3820 may comprise a first field 3821 and a second field 3822. The first field 3821 may be covered by a contact pad 212, which provides a wetting to liquefied solder material 100, whereas the material and/or the surface in the area of the second field 3822 may impede such a wetting.

According to this embodiment, the first field 3821 may comprise a round, a circular, or an elliptical shape. The second field 3812, however, may comprise one or more rectangular or square shaped fields that are connected to the first field 3821 and may be arranged relative to first field 3821 such that a direction parallel to a longer extension of the respective rectangle is oriented toward a center of the round shape. Reservoir volumes may be formed in the partial volumes of the blind hole 3820 above the second fields 3822. An injection of liquid solder material 100 from the reservoir volumes in this case may provide a spin to the liquid material, which, in turn, may improve a spherical geometry of a solder ball or a solder connection being formed. In addition to this, a round shape of the contact pad 212 in conjunction with a rectangular shape of the second field 3822 may improve the formation of a respective solder connection.

Figure 8B:
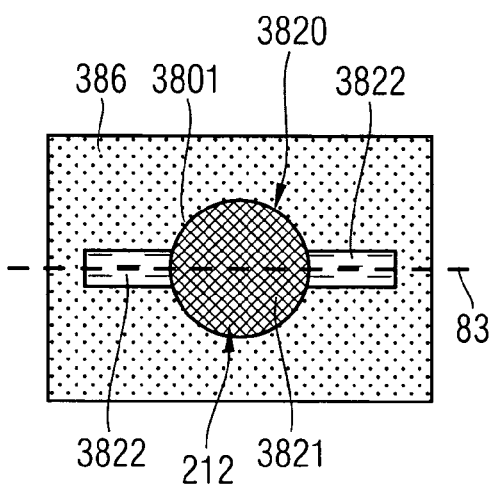

FIG. 8B shows a schematic top view of the blind hole 3820, as being described in conjunction with FIG. 8A. According to another embodiment, the blind hole 3820 may be arranged in a structured layer 386 that comprises and/or forms a continuous layer, for example, a continuous layer as being described in conjunction with FIGS. 5C and 5D.

Figure 8C:
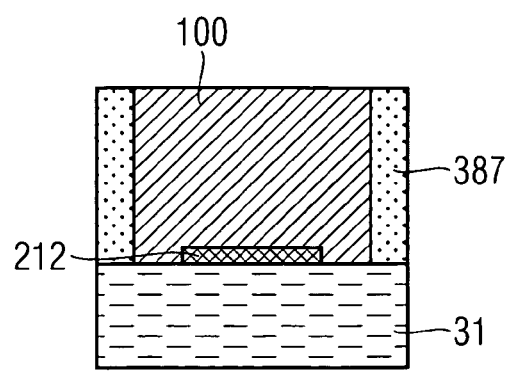

FIG. 8C shows a schematic cross-sectional view of the arrangement according to the embodiments as being described in conjunction with FIG. 8A or FIG. 8B. The cross-sectional view is along the axis 83 as drawn in those Figures and shows the blind hole 3820 in a structured layer 387, which may correspond to the structured layer 385 or to the continuous structured layer 386. In this view, the blind hole 3820 may be filled with the solder material 100 according to an embodiment of the present invention.

Figure 8D:
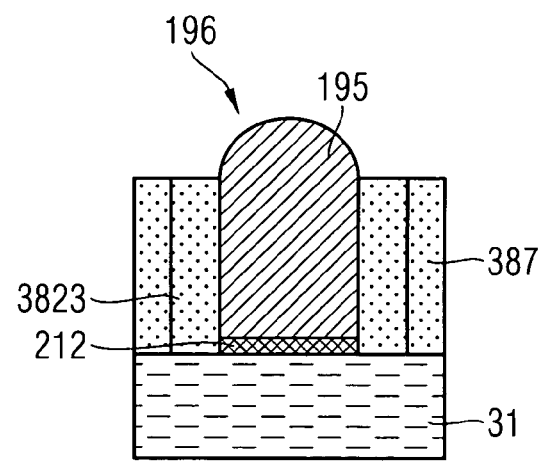

FIG. 8D shows a schematic cross-sectional view of the arrangement as drawn in FIG. 8C with a portion of the solder material 100 protruding from the blind hole 3820. During the protrusion process, solder material 100 may be displaced from reservoir volumes, such as the partial volumes above the second fields 3822. In this way, solder material 100 may be provided to form a protruding portion 196 of a solder connection 195. According to this embodiment, the size and volume of protrusion reservoirs may be independent from the size of the contact pad 212. In particular, the amount of solder material 100 which may be necessary to form the solder connection 193, may be an increased volume such to allow for even long and/or large solder connections 195.

The contact pads 210, 211, and/or 212, as well as the blind holes 3800, 3810, and/or 3820, as they have been described in conjunction with FIGS. 6A through 8D may correspond to one of the first contact pads 21, to the further contact pad 23, and to the blind holes 310, 350, and/or 370, as they have been described in conjunction with FIGS. 1A through 5D. The shape and/or size of these contact pads may determine or influence the size and shape of a respective solder ball or solder connection, which have been formed by means of ejecting solder material 100 from these holes and/or partial volumes thereof. In general, embodiments and the scope of the present invention shall not be limited to the shape and arrangements of blind holes as they have been described in conjunction with an embodiment. The invention may allow and provide different shapes and arrangements of blind holes in an effective and advantageous manner.

Figure 9A:
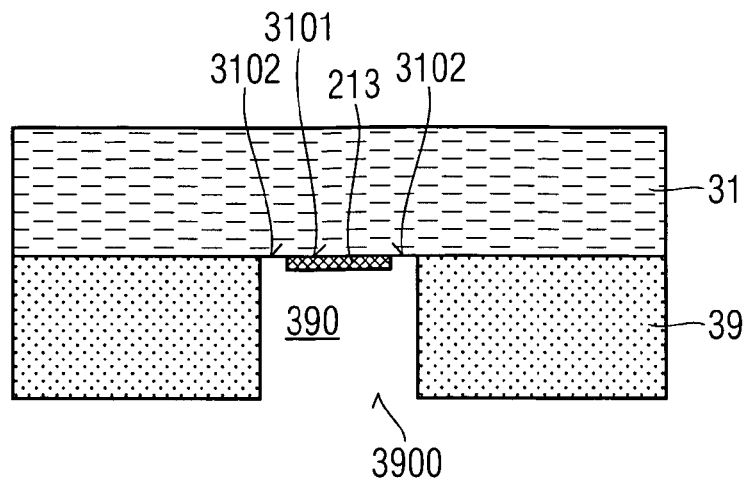
FIGS. 9A through 9F show schematic views of a solder connection in various stages during fabrication according to yet another embodiment of the present invention.

FIG. 9A through 9F show a solder connection in various stages during fabrication according to yet another embodiment of the present invention. As shown in FIG. 9A, a structured layer 39 may comprise a blind hole 390 with an aperture 3900 at a layer surface of the structured layer 39. The blind hole 390 may comprise or be any of the blind holes, as they have been described in conjunction with an embodiment of the present invention. On the substrate surface of the substrate 31 there may be arranged a contact pad 213 in the area of a first field 3101. Nevertheless, the contact pad 213 may be omitted, in the case that the material of the substrate 31 in the area of the first field 3101 provides wetting to a liquefied solder material 100.

In the blind hole 390 a first pressure may be provided. This first pressure may be a vacuum pressure, a low atmospheric pressure, atmospheric pressure, a pressure below 10 mbar, a pressure below 1 mbar, or a pressure below $10^{-1}$ mbar. The first pressure may be provided by placing the substrate 31 with together with the structured layer 39 into a recipient, in which a controlled atmosphere and/or vacuum may be provided by means of pumps and/or respective pressure gauges.

The structured layer 39 may comprise any polymer, plastic, or resist material, such as an SU-8 photoresist material, as has been described with an embodiment of the present invention. In general, however, any material may be suitable to form the structured layer 39, that withstands the temperature of the liquid solder material 100 in the bath 1000. Such a temperature may be in general above a melting temperature of the solder material 100, and, therefore, may be above 180° C., above 200° C., above 220° C., or above 240° C. The solder material 100 may comprise a common solder material, and may, therefore, comprise tin, copper, silver, lead, bismuth, or the like.

Figure 9B:
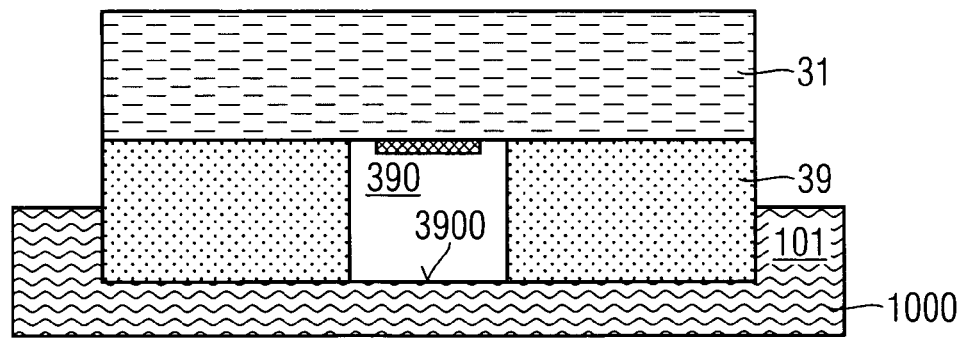

As shown in FIG. 9B, a bath 1000 of a liquid solder material 100 may be provided to the aperture 3900 of the blind hole 390. This may be effected, as shown, by dipping the structured layer 39 into the bath 1000. The liquid solder material may be in a liquid state and/or above a melting temperature of the solder material 100. Prior to dipping the structured layer 39 into the bath 1000, the structured layer 39 and/or the substrate 31 may be heated to the temperature of the bath 1000, or to a temperature close to the temperature of the bath 1000, such to reduce impacts from thermal stress to a minimum.

Furthermore, the liquid material 100 may be provided to the aperture 3900 of the blind hole 390, for example, by placing the liquid material 100 on the structured layer 39, or covering the structured layer 39 with the liquid solder material 100. In this case, the arrangement of the substrate 31 and the structured layer 39 may be handled up-side-down in respect to the arrangement as shown in FIG. 9A. Nevertheless, the first pressure is provided in the blind hole 390 prior to the covering of the structured layer 39.

Figure 9C:
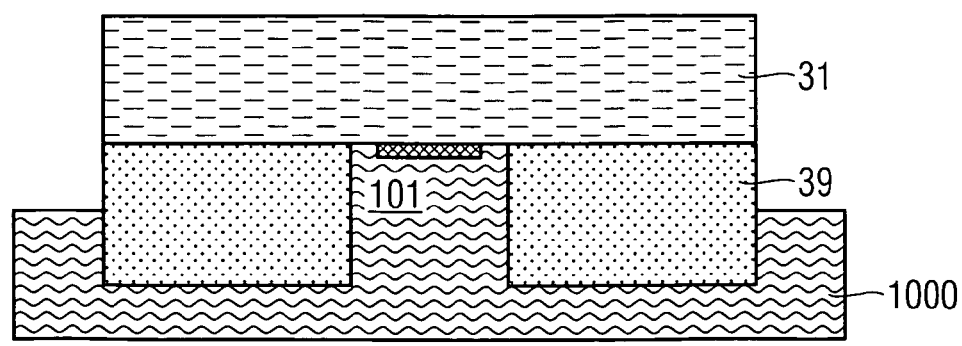

As shown in FIG. 9C, a second pressure is provided, acting onto the bath 1000 of the liquid solder material 100. According to this embodiment, the second pressure may be greater than the first pressure. The second pressure may be atmospheric pressure, high atmospheric pressure, in a range between 700 mbar and 1.3 bar, in a range of 1.3 bar and 3.0 bar, or in a range of 3.0 bar and 10.0 bar. By means of providing a second pressure, acting on the bath 1000, which is greater than the first pressure, liquid material 100 is pressed into the blind hole 390, thereby filling the blind hole 390 with the liquid solder material 100.

Figure 9D:
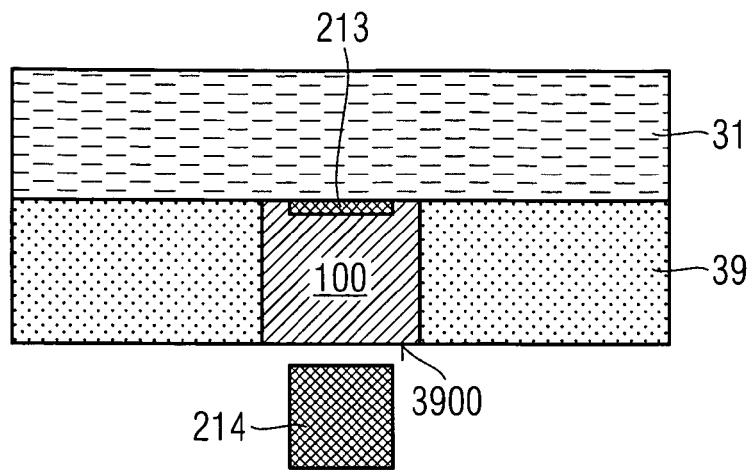

As shown in FIG. 9D, the arrangement of the substrate 31 and the structured layer 39 has been extracted from the bath 1000. While the second pressure may be maintained in a surrounding of the arrangement, the arrangement may be cooled such to allow for a solidification of the solder material 100 in the blind hole 390. In this way, the blind hole 390 remains filled, after solidification, with the solid solder material 100. Such solidification may be effected by a cooling of the arrangement with a well-defined and pre-determined temperature profile. A temperature profile comprises the controlled setting of the temperature of the arrangement of the substrate 31 and the structured layer 39 in respect to time.

During a subsequent stage, a second contact pad 214 may be provided in a vicinity of the aperture 3900 of the blind hole 390. The second contact pad 214 may be such as and/or arranged as a second contact pad as has been described in conjunction with an embodiment of the present invention. Furthermore, the second circuit pad 214 may be arranged on a circuit chip which is arranged with its edge close to the top face of the perforated layer 39.

Figure 9E:
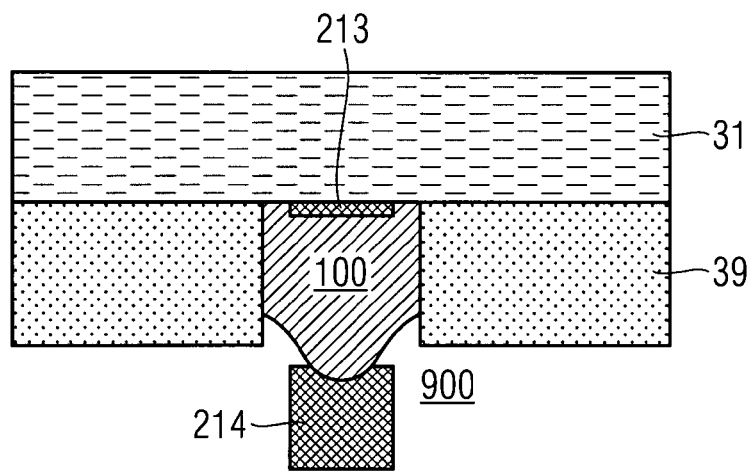

As shown in FIG. 9E, the solder material 100 in the blind hole 390 may again be liquefied. This liquefaction may effected by means of a heating stage, a soldering stage, a reflow soldering stage, or an infrared soldering stage. As shown, a portion of the solder material 100 may protrude from the opening 390, by means of a further heating and or liquefaction of the solder material 100. Whereas the solder material 100 is kept in place above the contact pad 213, solder material 100 may be expelled from the opening 390 when the facing material and/or surface impedes wetting to the liquefied solder material 100.

An expulsion of the respective solder material 100 may be effected by means of surface tension acting on a liquefied solder material 100 within the opening 390. Furthermore, a third pressure, being lower than the second pressure, may assist ejection, since gas voids included during the filling of the blind holes 390 with the solder material 100 may now expand. Such an ejection may include the transfer of solder material 100 from a reservoir volume of the blind hole 390, being arranged above the second field 3102. Such an expulsion, heating, or liquefaction may be conducted in a vacuum, in a vacuum below 10 mbar, in a vacuum below 1 mbar, or in a vacuum below $10^{-1}$ mbar.

Furthermore, during this stage, a protective atmosphere 900 may be provided adjacent to the liquefied solder material 100 and/or the surface of the second contact pad 214. Such a protective atmosphere 900 may comprise a hydrogen-plasma, formic acid, forming gas, a combination of hydrogen and nitrogen, a flux, collophony, urea, zinc chloride, a reducing atmosphere, and/or a gaseous form of related flux and reducing materials as they are known from the soldering technology.

In this way, according to a further embodiment of the present invention, an oxide-layer on the solder material 100 in an area of the aperture 3900 may be removed. Such an oxide may be formed on the solder material 100, when exposed to air, oxygen, or atmospheric conditions. The removal may be effected by an exposure of the oxide, or the filled structured layer 39 to the protective atmosphere 9000. The removal of an oxide may be carried out prior to or during a reflow soldering process, or, in general, prior or during the ejection of the solder material from the opening.

By means of liquefaction of the solder material, forming a portion of a liquefied solder material 101 within the blind hole 390, a portion of the solder material may protrude from the blind hole 390. This is by means of the fractions 3102 of the floor of the substrate 31 and/or the side walls of the blind hole 390, which may impede a wetting by a liquefied solder material 101.

Since the surface and/or the material of the first contact pad 230 may provide a wetting by the liquefied solder material 101, the liquefied portion of the solder material may contract and form a protruding portion of liquefied solder material 101 which extends from the aperture 3900 of the blind hole 390. At this stage, the top portion of the liquefied solder material 101 may form physical contact with the second contact pad 214. Since the material thereof and/or the surface of the second contact pad 214 may provide a wetting by the liquefied solder material 101, further liquefied solder material 101 is extracted from the opening 419. In this way, more and more of the surface of the second contact pad 214 may be covered by the liquefied solder material 101 and more and more liquefied solder material 101 may be extracted from the blind hole 390. However, since the surface of the first contact pad 213 may also provide a wetting by the liquefied solder material 101, a solder connection, in form of a bridge, may be formed, coupling the first contact pads 213 to the second contact pad 214.

In conjunction with surface tension, tension, or pressure effects, a wetting force may assist the formation of the solder connection 19. As soon as liquid solder material 100 touches the second contact pad 214, wetting of the pad 214 may start and drag liquid solder material 100 from the blind hole 390.

Figure 9F:
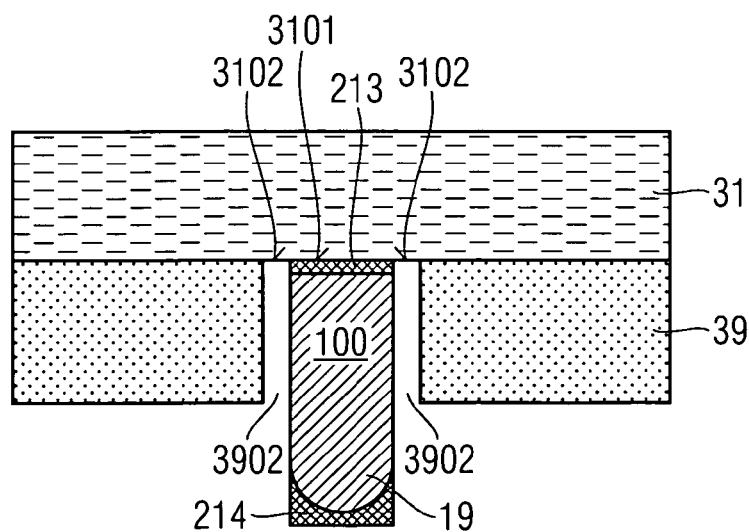

As shown in FIG. 9F, the solder material 100 may form, after solidification, a solder connection 19, coupling the first contact pad 213 to the second contact pad 214. As compared to the arrangement as shown in FIG. 9D, solder material 100 may be expelled from partial volumes 3902 of the blind hole 390. These partial volumes 3902, being arranged above the second fields 3102 of the floor of the blind hole 390 and adjacent to the side walls of the blind hole 390 within the perforated layer 39 may thus act as a material reservoir providing excess solder material 100 for the formation of the solder connection 19.

According to further embodiments of the present invention, a contacting of a chip stack may be effected without the need for through-silicon-vias (TSV), which require a more complex fabrication process and, hence, cause more cost. Furthermore, through-silicon-vias may require a redistribution of signals and/or paths thereof. In addition, a chip select may be directly routed along the substrate, which may be impossible or much more difficult in the case through-silicon-vias are applied, and in the case one of the through-silicon-vias is defective, the entire chip stack or the entire integrated circuit may be rendered useless and worthless. In contrast to that, according to a further embodiment of the present invention, the remainder of the circuit chips may still be active and accessible, even if a connection to one of the circuit chips is defective.

Also, contacting of circuit chips, a stack thereof, and/or a substrate may require bond wires, which may be rendered obsolete by an embodiment of the present invention. While the application of bond wires may be a time consuming, costly, and sequential process, since every chip must be processed and bonded separately, here a parallel and scalable way is provided to achieve such contacting. In addition, a much more simple process according to an embodiment of the present invention may only require a simplified fabrication equipment, while allowing for an increased process yield and/or a reduction of cost.

According to a further embodiment of the present invention, a solder ball may be formed on the surface of a substrate or a structured layer by means of ejecting solder material from the blind holes. The formation of solder balls may further be effected prior to a placement of the stacked chips next to the substrate. In a subsequent stage a solder connection between the substrate and a circuit chip of the chip stack may be formed, by soldering the solder ball to a respective contact pad.

According to a next embodiment of the present invention, the fabrication of the substrates with the structured layer may be effected on a wafer level, i.e. a plurality of substrates and respective structured layer may be fabricated on a single substrate wafer, which is, subsequently, singularized in order to provide the single substrates.

According to yet a further embodiment of the present invention, technical obstacles, such as crack-stop, may be avoided or eliminated by means of partially sawing the wafer prior to the provision of a redistribution layer, a structured layer, and/or a spacer layer. This may include a provision and a structuring of the respective layer, and may include an exposing of the contact pads on the chip and/or on the substrate. Thereafter, the wafer may be thinned, for example, by means of grinding down to a thickness in a range of 50 microns, and a damage etching and a passivation may be applied.

Such a passivation may then also cover a side wall of a chip. The single chips may then be glued together, e.g. by means of the material of the structured layer and/or the spacer layer. By means of an appropriate exposure of the resist material, the layer of this material may then be solidified even in an area of the edges of the chip, and, hence, may provide an electric insulation. This may require a singularization of the chips after thinning and a sticking of the chips amongst each other may have to be suppressed. A thinning may be effected on a wafer carrier and the adhesion of the chips may also be effected on both sides of the chips, i.e. material of the spacer layer is applied on both sides of a circuit chip. Insulation of the thinned chips and the provision of an adhesive surface may then be effected in a single process stage.

The preceding description only describes advantageous exemplary embodiments of the invention. The features disclosed therein and the claims and the drawings can, therefore, be important for the realization of the invention in its various embodiments, both individually and in combination. While the foregoing is directed to embodiments of the present invention, other and further embodiments of this invention may be devised without departing from the basic scope of the invention. The scope of the present invention being determined by the claims as follows.

What is claimed is:

1. An article, comprising:
a substrate having a blind hole formed therein, wherein the blind hole is defined by a floor and a sidewall; and
a solder connection coupling a first contact pad to a second contact pad, the first contact pad covering a first field of the floor and promotes wetting of a solder material of the solder connection, wherein wetting is impeded on a second field of the floor, and the second contact pad being arranged above a surface of a further substrate, the surface of the further substrate being oriented perpendicularly to the floor of the blind hole in the substrate.

2. The article of claim 1, the substrate comprising:
a structured layer as a top layer, wherein a through hole of the structured layer and a surface of an underlying remainder of the substrate form the blind hole; and
a material of the structured layer that impedes the wetting.

3. The article of claim 1, wherein a surface plane of the second contact pad intersects at least in part with the surface of the further substrate within an area of an aperture of the blind hole.

4. The article of claim 1, wherein a gap is arranged between an edge of the second contact pad, and an edge of the substrate facing the further substrate.

5. The article of claim 1, wherein a cross section of the blind hole comprises a first field and a second field, the first field comprising a round area, the second field comprising a rectangular area with an orientation parallel to a longer extension of the rectangular area being oriented toward the center of the round area, and an area of the first contact pad fitting into the round area.

6. The article of claim in claim 1, wherein a cross section of the blind hole comprises a first field, a second field, and a third field, the first field and the second field being rectangular areas, the first field being arranged next to the second field, the first field and the second field being connected by the third field, and an area of the first contact pad fitting into the first field.

7. The article of claim 1, wherein the blind hole comprises a rectangular area, an area of the first contact pad fitting into the rectangular area.

8. The article of claim 1, the blind hole comprising a first partial volume and a second partial volume, the first partial volume being filled with the solder material, and the second partial volume being devoid of any solder material.

9. The article of claim 1, the solder material comprising any material from the group of a solder alloy, tin, copper, silver, lead, bismuth, a flux material, collophony, a resin, urea, formic acid, and zinc chloride.

10. An integrated circuit, comprising:
a substrate comprising a blind hole in a surface of the substrate, a first contact pad being arranged on a floor of the blind hole, the first contact pad covering a first field of the floor, and the wetting by a solder material being impeded in the area of a second field of the floor;
a chip stack comprising circuit chips, top faces of the circuit chips being oriented perpendicular to the surface of the substrate, a second contact pad being arranged on the top face of a circuit chip and above an aperture of the blind hole of the substrate; and
a solder connection comprising the solder material and coupling the first contact pad to the second contact pad.

11. The integrated circuit of claim 10, a gap being arranged between a side face of the chip stack and the surface of the substrate, wherein the side face is oriented parallel to the surface of the substrate.

12. The integrated circuit of claim 10, a spacer layer being arranged between two circuit chips of the chip stack and the spacer layer exposing the second contact pad.

13. The integrated circuit of claim 10, the substrate comprising a signal distribution layer and a structured layer as a top layer, a through hole of the structured layer and a surface of the signal distribution layer forming the blind hole, and the signal distribution layer being coupled to the first contact pad.

14. The integrated circuit of claim 13, the structured layer comprising a further blind hole, an aperture of the further blind hole being arranged on a side face of the structured layer, the side face being perpendicular to the surface of the substrate.

15. The integrated circuit of claim 14, a further contact pad being arranged in the further blind hole, the further contact pad being coupled to the signal distribution layer, and the further blind hole being at least in part filled with the solder material.

16. The integrated circuit of claim 10, the circuit chips of the chip stack being memory circuit chips comprising identical memory circuits.

17. A circuit system comprising an integrated circuit on a circuit board, the integrated circuit comprising:
a substrate comprising a blind hole in a surface and a further blind hole in a side face, a first contact pad being arranged in the blind hole and a further contact pad being arranged in the further blind hole, a wetting by a solder material being impeded on surfaces of the respective blind holes not covered by a contact pad;
a chip stack, wherein surfaces of the chips are oriented perpendicularly to the surface of the substrate, and wherein a second contact pad is arranged on a chip surface and above an aperture of the blind hole of the substrate; and
a solder connection comprising the solder material and coupling the first contact pad to the second contact pad, the circuit board comprising a contact pad facing an aperture of the further blind hole, and the contact pad on the circuit board being coupled to the further contact pad by a further solder connection.

18. The circuit system of claim 17, the chip stack comprising any memory chip from the group of an electronic memory chip, a volatile memory chip, a non-volatile memory chip, a dynamic random access memory chip, a flash RAM chip, a conductive bridging RAM chip, a magnetic RAM chip, and a phase change RAM chip.

19. The circuit system of 17, the circuit board comprising any circuit board from the group of a printed circuit board, a memory module board, a motherboard, and a chip carrier board.

20. A method of forming a solder connection, comprising:
providing a substrate comprising a blind hole in a surface and comprising a first contact pad on a floor of the blind hole, a wetting by a solder material being impeded in the area of the blind hole not being covered by the first contact pad;

filling the blind hole with the solder material;

providing a second contact pad above an area of an aperture of the blind hole, the second contact pad being arranged on a surface perpendicular to the floor of the blind hole, and liquefying the solder material, thereby causing a portion of the solder material to protrude from the blind hole, the portion wetting a fraction of the second contact pad, thereby forming a solder connection from the first contact pad to the second contact pad.

21. The method of claim 20, the filling of the blind hole comprising:

providing a bath of a liquid solder material;

providing a first pressure in the blind hole and atop the bath;

dipping the substrate into the bath, thereby covering an aperture of the blind hole with the liquid solder material;

providing a second pressure to the bath, the second pressure being greater than the first pressure, thereby filling the blind hole with the solder material;

retracting the substrate from the bath; and solidifying the solder material in the blind hole.

22. The method of claim 20, the liquefying of the solder material comprising any process of the group of a soldering process, a heating process, a reflow process, and an infrared soldering process.

23. A method of manufacturing an integrated circuit comprising a chip stack and a substrate, a chip of the chip stack comprising a contact pad within a rim area of a chip surface, the substrate comprising a blind hole, a first contact pad being arranged in the blind hole, and a wetting by a solder material being impeded in the area inside the blind hole not covered by the contact pad, the method comprising:

filling the blind hole with the solder material;

arranging the chip stack and the substrate such that a side face of the contact pad on the chip faces an area of an aperture of the blind hole; and liquefying the solder material, thereby causing a portion of the solder material to protrude from the blind hole, the portion wetting a fraction of the contact pad on the chip, thereby forming a solder connection from the contact pad in the blind hole to the contact pad on the chip.

24. The method of claim 23, the filling of the blind hole comprising:

providing a bath of a liquid solder material;

providing a first pressure in the blind hole and atop the bath;

dipping the substrate into the bath, thereby covering an aperture of the blind hole with the bath;

providing a second pressure to the bath, the second pressure being greater than the first pressure, thereby filling the blind hole with the solder material; and retracting the substrate from the bath.

25. The method of claim 23, further comprising:

providing a reducing atmosphere adjacent to the solder material prior to liquefying the solder material.

* * * * *